(12) United States Patent  (10) Patent No.: US 6,301,278 B2
Uchida                     (45) Date of Patent: *Oct. 9, 2001

(54) SEMICONDUCTOR LASER DEVICES

(75) Inventor: Satoshi Uchida, Kyoto (JP)

(73) Assignee: Rohm Co., Ltd., Kyoto (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/119,696

(22) Filed: Jul. 21, 1998

(30) Foreign Application Priority Data

Sep. 25, 1997 (JP) .................................................. 9-260161

(51) Int. Cl.$^7$ ................................. H01S 3/04; H01S 5/00
(52) U.S. Cl. ................................................. 372/36; 372/43
(58) Field of Search ................................ 372/43–50, 33, 372/36; 174/262; 257/99

(56) References Cited

U.S. PATENT DOCUMENTS 5,005,178 * 4/1991 Kluitmans et al. ..................... 372/36
5,022,035 * 6/1991 Hasegawa .............................. 372/36
5,382,758 * 1/1995 Iacovangelo et al. ............... 174/262
5,706,302 * 1/1998 Shimizu ................................. 372/36

FOREIGN PATENT DOCUMENTS 01-138778 * 5/1989 (JP) .
02-186648 * 7/1990 (JP) .
04-007881 * 1/1993 (JP) .
06-188516 * 7/1994 (JP) .

OTHER PUBLICATIONS

Mayer et al, Electronic Materials Science: For Integrated Circuits in Si and GaAS, New York: Macmillan Publishing Company, Jan. 1990, pp. 44–45.*
Thompson, Physics of Semiconductor Laser Devices, New York: John Wiley & Sons, Jan. 1980, pp. 1–8.*

* cited by examiner

Primary Examiner—Quyen P. Leung
(74) Attorney, Agent, or Firm—Coudert Brothers

(57) ABSTRACT

A semiconductor laser device has a semiconductor laser element placed inside a package on an electrically conductive submount such that one of the electrodes with one conduction type sandwiching its p-n junction is electrically connected to it. The submount is placed on a metallic heat sink, separated therefrom by a layer of an electrical insulator having a larger thermal conductivity than the submount. The other electrode of the laser element (of the opposite conduction type) is electrically connected to the heat sink, and one of externally extending lead pins is electrically connected to the submount. According to a preferred embodiment, the other electrode of the laser element is electrically connected instead to one of the lead pins and the submount is electrically connected instead to another of the lead pins. Thus, the capacitance of the submount and the inductance of the package will be in an electrically floating condition when the laser device is activated, and the device is adapted for high-frequency operations.

18 Claims, 7 Drawing Sheets

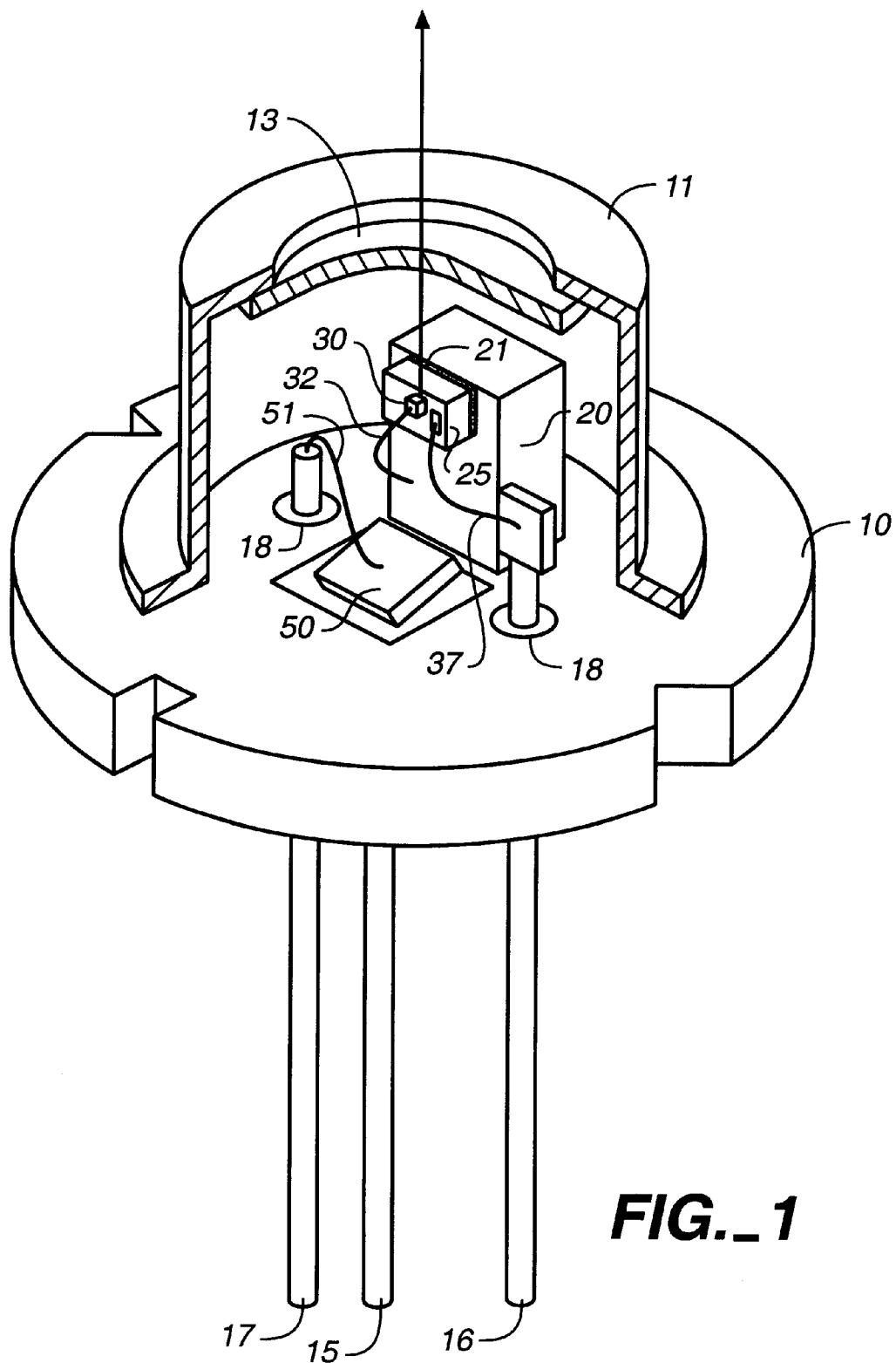
FIG._1

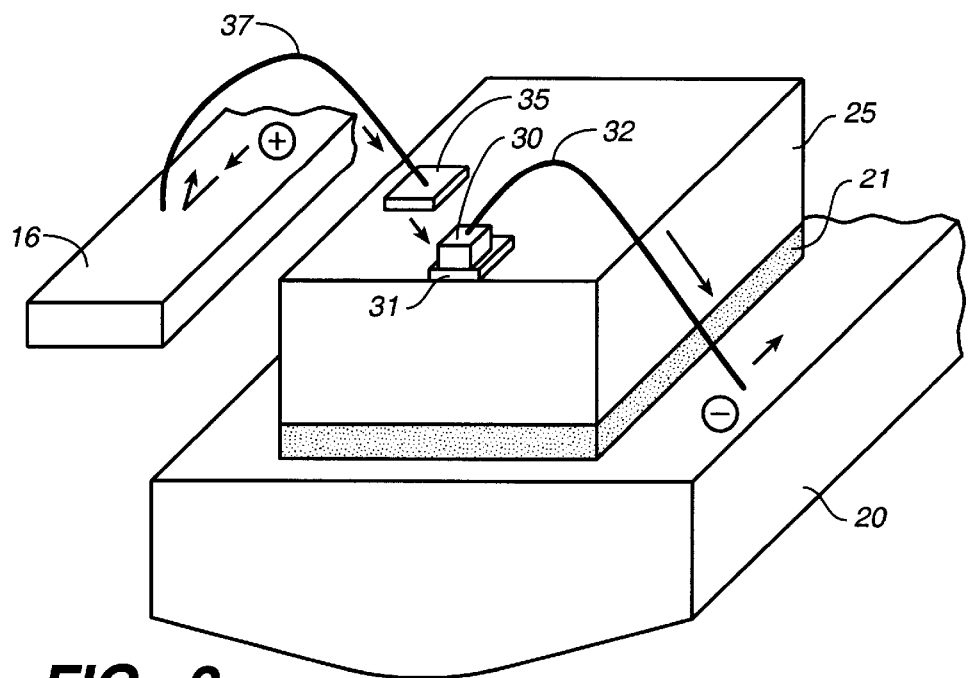
FIG._2
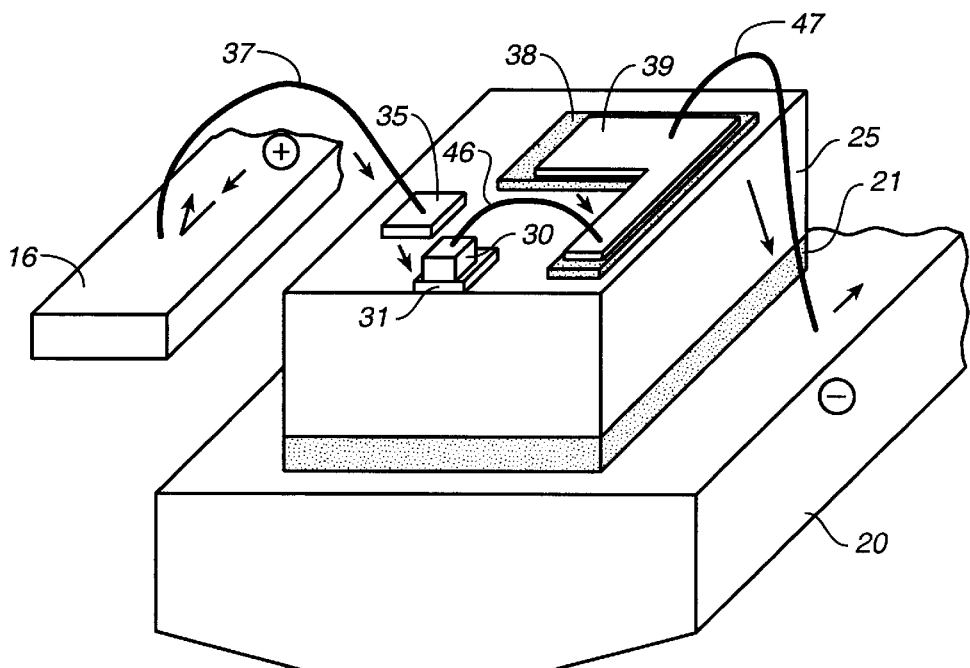
FIG._3

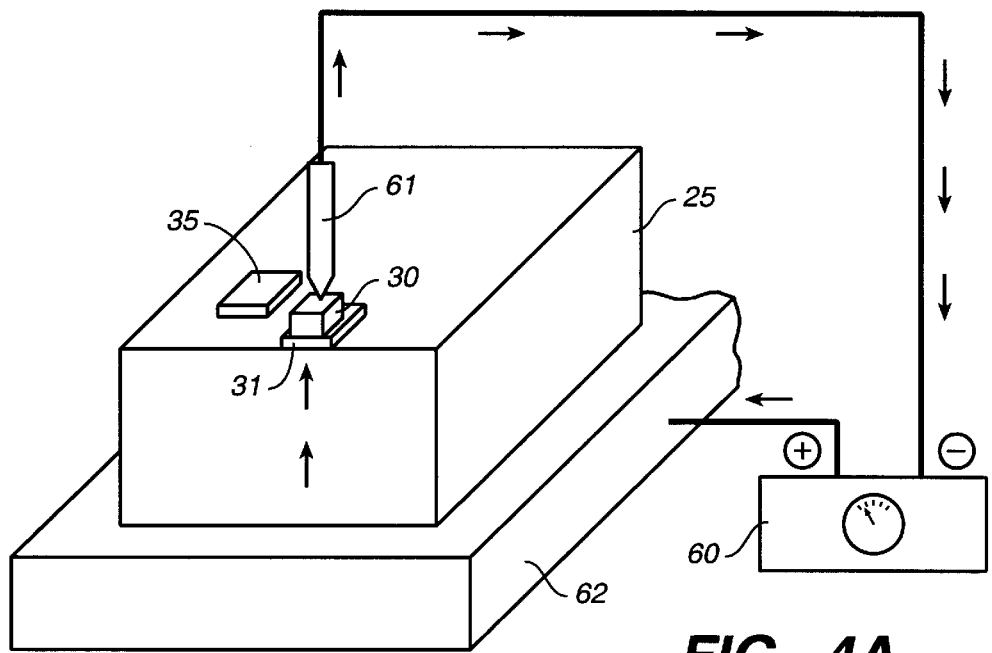
FIG._4A
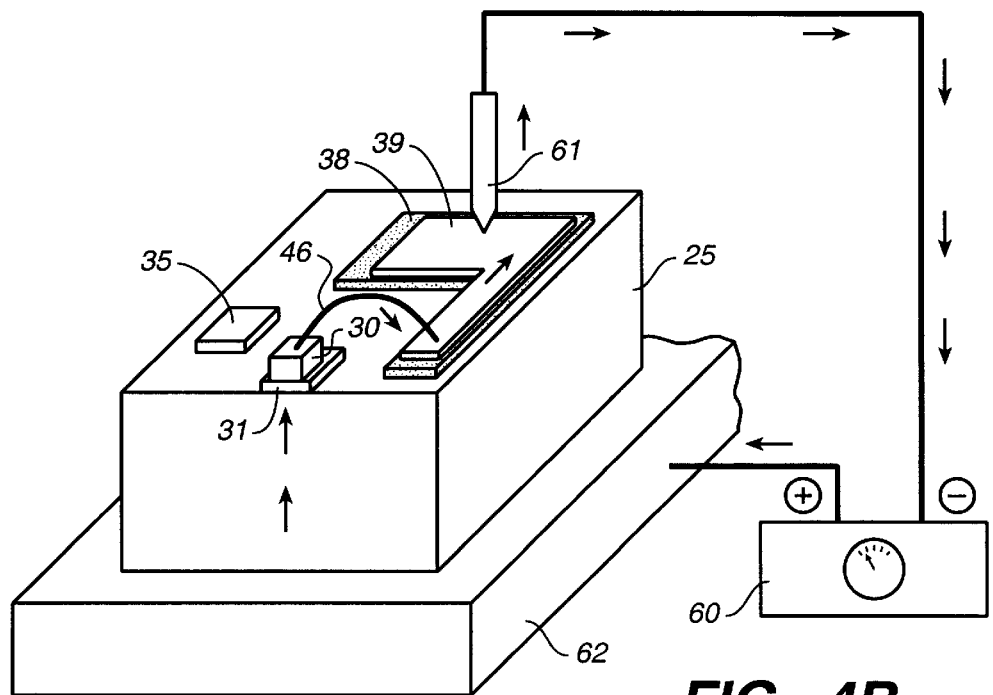
FIG._4B

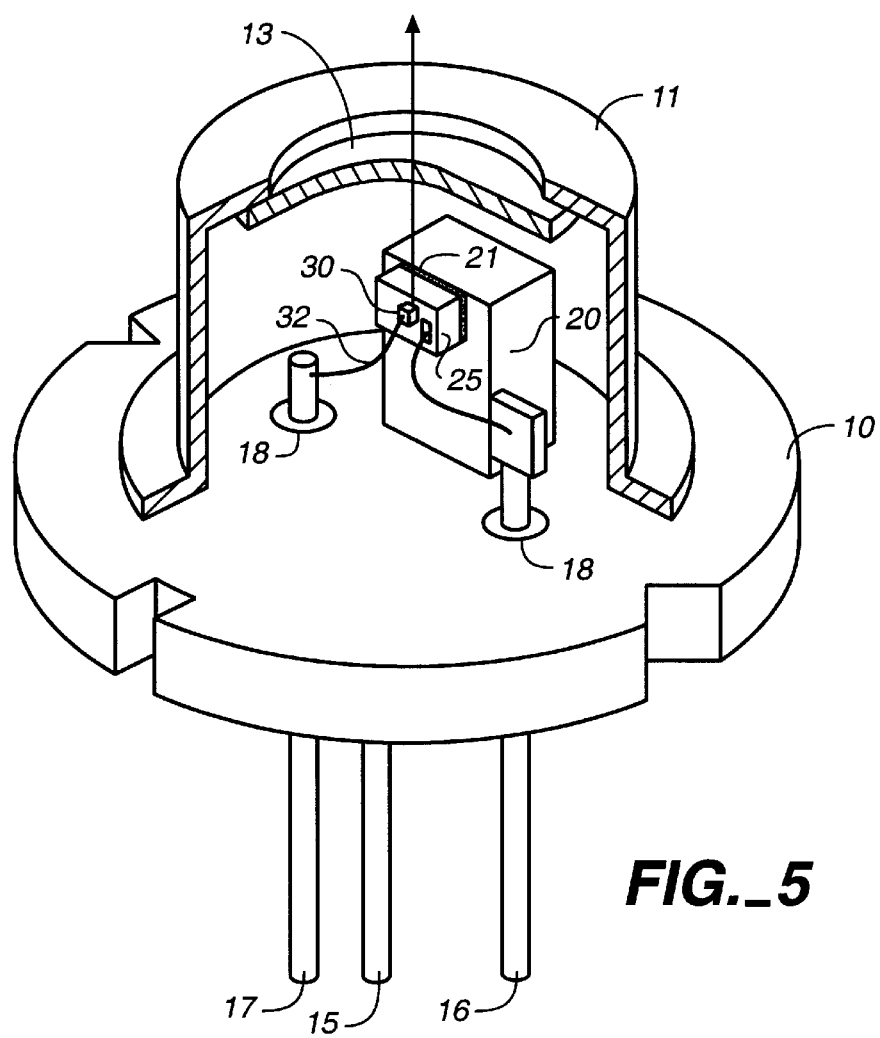
FIG._5
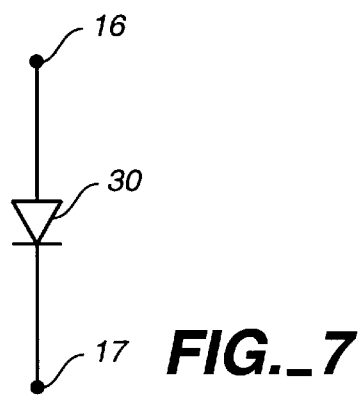
FIG._7

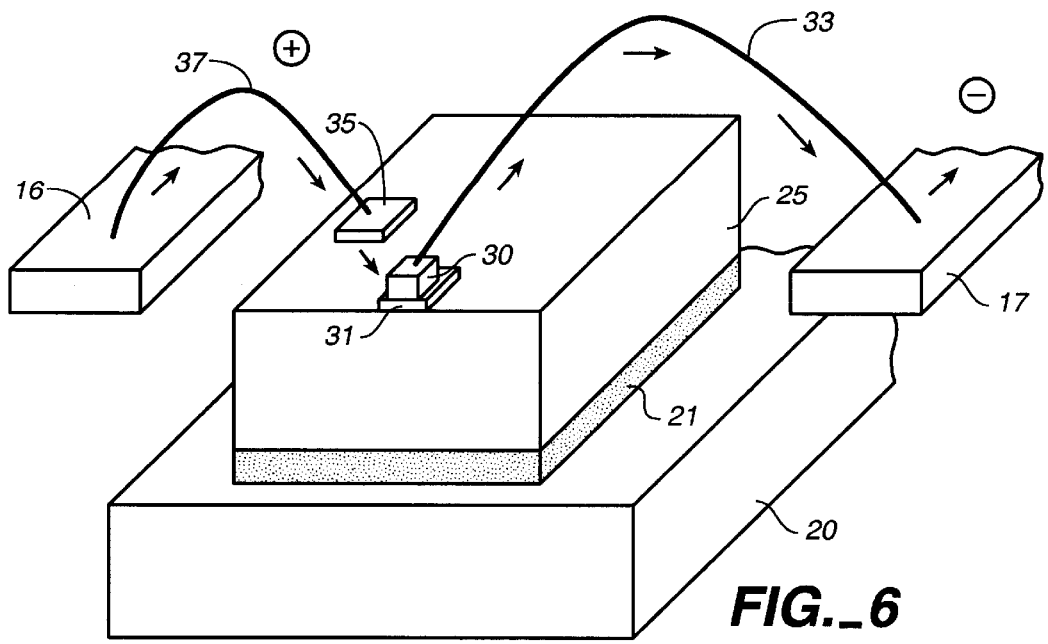
FIG._6
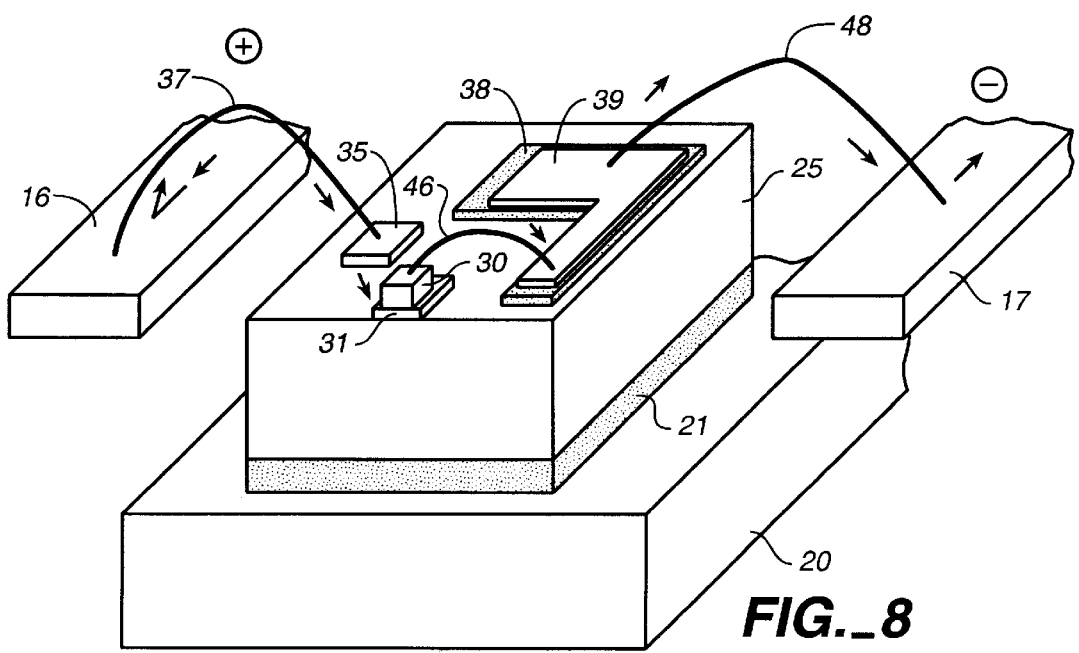
FIG._8

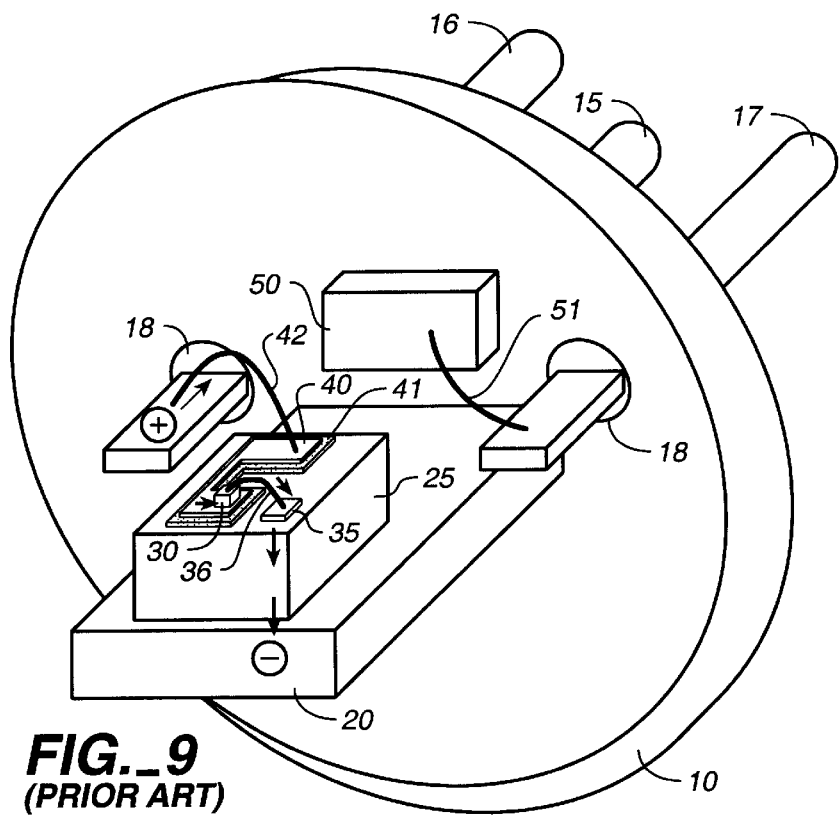
FIG._9 (PRIOR ART)
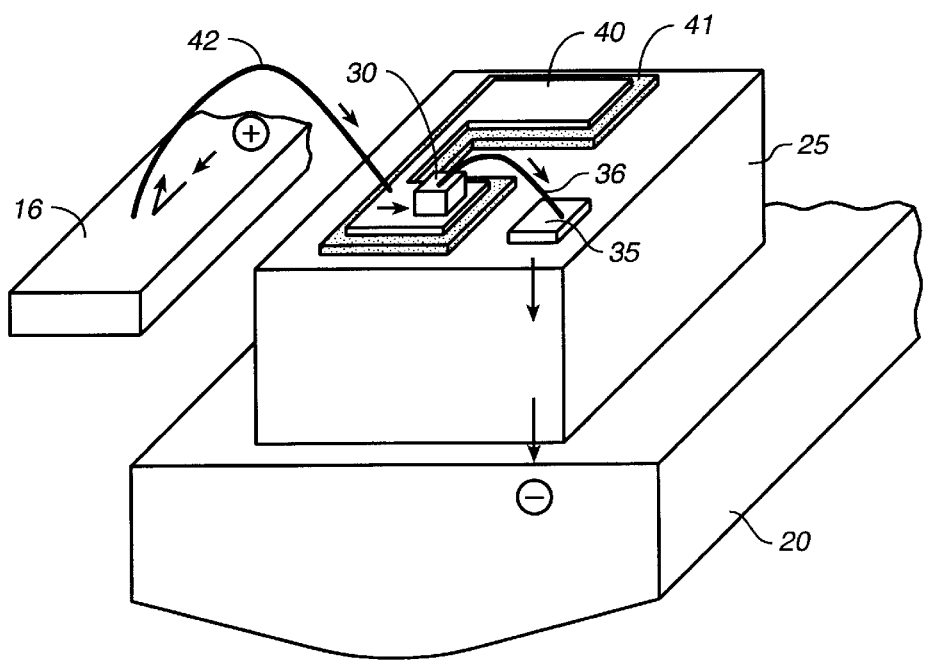
FIG._10 (PRIOR ART)

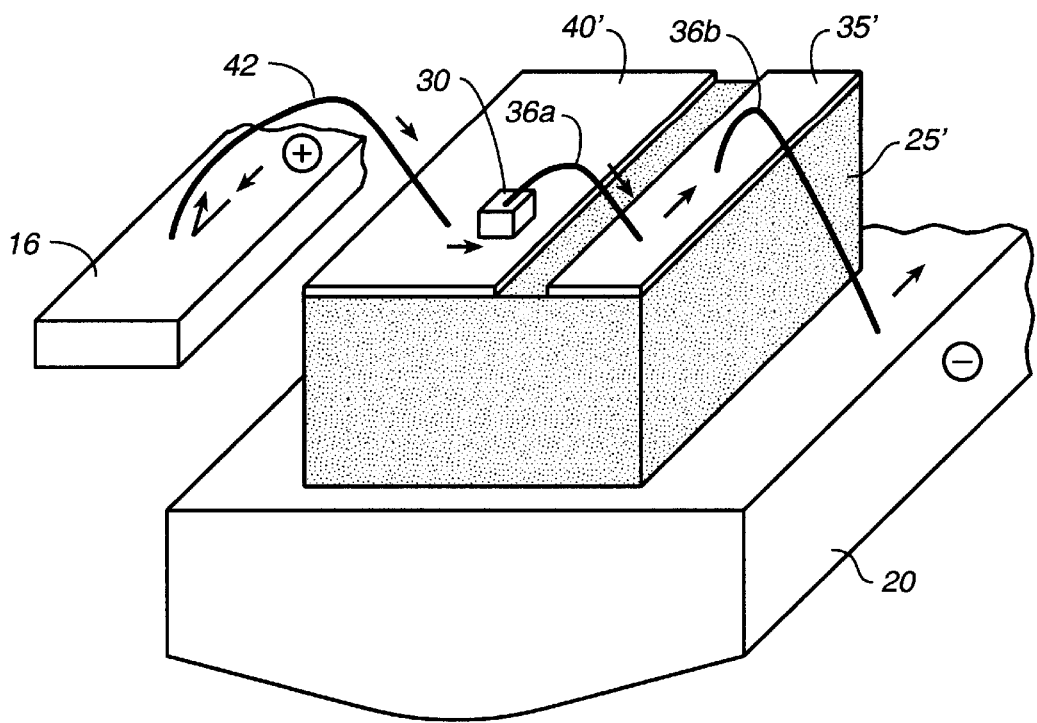
FIG._11 *(PRIOR ART)*
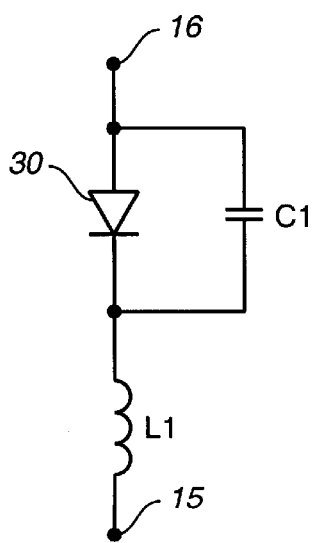
FIG._12
*(PRIOR ART)*

SEMICONDUCTOR LASER DEVICES

BACKGROUND OF THE INVENTION

This invention relates to semiconductor laser devices capable of effectively transmitting heat away and in particular to such semiconductor laser devices adapted for high-frequency operations.

Semiconductor laser devices incorporating a semiconductor laser element as a pick-up light source for a writable disk drive or the like have been known. Such a semiconductor laser element emits laser light as an electric current is caused to flow across its internal p-n junction, but a large amount of heat is also generated at the same time. In order to efficiently remove this heat, such a laser element is commonly mounted with its p-surface downward (according to the so-called "junction-down" mounting format) to a silicon submount with a high thermal conductivity such that the generated heat is quickly conducted away therethrough. This mounting format is considered advantageous because the distance between the p-n junction which is the source of the generated heat and the submount can be reduced with the p-surface of the laser element facing downward.

FIGS. 9 and 10 show a prior art semiconductor laser device structured in this manner. Three externally extending lead pins 15, 16 and 17 (referred to for convenience as "the first", "the second" and "the third", respectively) are attached to a disk-shaped member 10 (referred to as "the stem"), the first pin 15 being directly attached to the stem 10 so as to be electrically connected therewith, while the second and third pins 16 and 17 are each affixed to the stem 10 by way of an insulator 18. A heat sink 20, which may comprise a material such as Cu, is soldered to a main surface of the stem 10 and an electrically conductive silicon submount 25 is attached to the heat sink 20. On the surface of the submount 25, there is not only an Al wiring pattern 40 formed through an oxide layer 41 comprising $SiO_2$ but also an Al pad formed directly.

A semiconductor laser element 30 is deposited on this Al wiring pattern 40 in the aforementioned junction-down format such that the heat generated thereby can be efficiently conducted away therefrom. The n-surface of the laser element 30 and the Al pad 35 are electrically connected by a metallic wire 36.

The second lead pin 16, which serves to supply power therethrough to the laser element 30, is extended internally to a position near the submount 25 and is electrically connected to the Al pattern 40 by another metallic wire 42.

A light-receiving element 50, which serves to receive the laser light emitted backwards from the laser element 30 and to thereby monitor its optical output, is directly mounted to the main surface of the stem 10, and its upper surface is electrically connected to the third lead pin 17 by still another metallic wire 51. All these components described above, inclusive of the laser element 30, are sealed inside a cap (not shown in FIGS. 9 and 10) to form a packaged product.

When a semiconductor laser device thus formed is used for an optical disk, for example, the heat sink 20 and the second pin 16 respectively serving as the negative electrode and the positive electrode, a current flows from the second pin 16 sequentially through the metallic wire 42, the Al pattern 40, the p-surface of the laser element 30, its n-surface, the wire 36, the Al pad 35 and the submount 25 to the heat sink 20, as shown by arrows, such that laser light is emitted from the laser element 30.

It is to be noted, regarding the prior art semiconductor laser device described above, that the Al pattern 40, on which the laser element 30 is deposited, and the electrically conductive submount 25 must be separated from each other by the electrically insulating oxide layer 41 both because the laser element 30 must be mounted to the submount 25 in the junction-down format and because the heat sink 20 must be used as the negative electrode. Since the thermal conductivity of the oxide layer comprising $SiO_2$ is 1.4–7.2 W/m° K and is much smaller than that of the silicon submount 25 (about 150 W/m° K), this means that the heat generated by the laser element 30 cannot be efficiently conducted away to the submount 25.

In view of the above, it has also been known to use a submount made of a material other than silicon such as AlN that is electrically insulating but has a larger thermal conductivity (160–200 W/m° K) than silicon. FIG. 11 shows another prior art semiconductor laser device characterized (and distinguishable from the example shown in FIGS. 9 and 10) as having a submount 25' made of electrically insulating AlN attached on top of a heat sink 20 comprising Cu or the like. Two Al wiring patterns 40' and 35' are formed on the surface of the AlN submount 25' such that they are electrically separated from each other, and a laser element 30 is deposited on the Al pattern 40' in the junction-down format. The n-surface of the laser element 30 and the Al pattern 35' are connected to each other electrically by a metallic wire 36a, and the Al pattern 35' and the heat sink 20 are connected electrically to each other by another metallic wire 36b. The Al pattern 40' is also electrically connected through still another metallic wire 42 to a lead pin 16 for supplying a current from an external source (not shown). With a semiconductor laser device thus structured, a current flows from the pin 16 sequentially through the wire 42, the Al pattern 40', the p-surface of the laser element 30, its n-surface, the wire 36a, the Al pattern 35' and the wire 36b to the heat sink 20, as shown by arrows, such that laser light is emitted from the laser element 30.

The semiconductor laser device described above with reference to FIG. 11 can therefore be cooled more efficiently because the heat generated by its laser element 30 can be conducted off to the thermally conductive AlN submount 25' only through the Al pattern 40'. The use of a submount made of AlN, instead of silicon, however, has the following practical problem.

When semiconductor laser devices are produced, screening tests therefor for quality control are not easy to carry out if they are to be carried out only on the laser elements because semiconductor laser elements are extremely small. Thus, screening tests are usually carried out after the laser elements are each deposited on a submount. In other words, a test on electrical and optical characteristics of each laser element is carried out not on the laser element alone but on the combination consisting both of the laser element and also of the submount on which it is deposited. If the test on a combination shows that an adjustment is required, such an adjustment is made, say, by a so-called burn-in process, and the adjusted combination is then attached to a heat sink. If the test shows that it is not adjustable, however, the combination is discarded as a whole. In summary, if a laser element is unadjustably defective, the submount to which it is mounted is also discarded. Since silicon submounts are relatively inexpensive, the procedure described above is not impractical, not incurring a serious economical loss. Since AlN submounts are significantly more expensive (say, by a factor of several tens) than silicon submounts, the loss due to discarded AlN submounts can significantly affect the production cost of the laser devices.

It is therefore an object of this invention to provide a semiconductor laser device from which generated heat can be effectively removed although a silicon submount is used for mounting a semiconductor laser element thereto.

Another problem with prior art semiconductor laser devices as described above with reference to FIGS. 9, 10 and 11 is that their submount serves as a capacitor (with capacitance C1) and its package contributes an inductance L1 when they are operated such that their equivalent circuit diagram may look as shown in FIG. 12. It now goes without saying that such capacitance C1 and inductance L1 effectively prevent a high-frequency operation of the device.

It is therefore a further object of this invention to provide a semiconductor laser as described above which can also be adapted for high-frequency operations.

SUMMARY OF THE INVENTION

A semiconductor laser device embodying this invention, from which generated beat can be effectively removed although a relatively inexpensive silicon submount is used for mounting a semiconductor laser element thereto, may be characterized as having an electrical insulator with a high thermal conductivity disposed between and in contact with a metallic heat sink and an electrically conductive, relatively inexpensive submount such as comprising Si. A semiconductor laser element of a known kind is disposed on the submount according to the known junction-down format such that its p-surface is electrically connected to the submount. The n-surface of the laser element is electrically connected to the heat sink, and the submount is electrically connected to one of the lead pins which extends externally.

According to a preferable embodiment, the n-surface of the laser element and the submount are each electrically connected instead to different ones of the lead pins extending externally such that when the device is operated, the capacitance of the submount and the inductance of the package connected to the heat sink will be in floating conditions and hence that the device is adapted for high-frequency operations.

It is further preferred to have a metallic member such as a wiring pattern formed on the submount with an electrically insulating layer in between and to make the electrical connection between the n-surface of the laser element and the heat sink or a lead pin to include this member. When the device is tested with a measuring device including a probe, the probe may be pressed on such a member provided on the submount, instead of the laser element itself. Since the laser element is sensitive to pressure, it is preferable not to press the probe against the laser element for a test.

BRIEF DESCRIPTION OF THE DRAWINGS

The accompanying drawings, which are incorporated in and form a part of this specification, illustrate embodiments of the invention and, together with the description, serve to explain the principles of the invention. In the drawings:

FIG. 1 is a diagonal external view of a semiconductor laser device according to a first embodiment of this invention with a portion of its cap removed to schematically show its internal structure;

FIG. 2 is a schematic diagonal view of a portion of the laser device of FIG. 1 inside its cap;

FIG. 3 is a schematic diagonal view of a portion of another semiconductor laser device according to a second embodiment of the invention;

FIGS. 4A and 4B are schematic drawings respectively of the semiconductor laser elements mounted according to the first and second embodiment of this invention when they are being tested;

FIG. 5 is a diagonal external view of still another semiconductor laser device according to a third embodiment of this invention with a portion of its cap removed to schematically show its internal structure;

FIG. 6 is a schematic diagonal view of a portion of the laser device of FIG. 5 inside its cap;

FIG. 7 is an equivalent circuit diagram of the laser device of FIGS. 5 and 6;

FIG. 8 is a schematic diagonal view of a portion of still another semiconductor laser device according to a fourth embodiment of the invention;

FIG. 9 is a diagonal external view of a prior art semiconductor laser device with a portion of its package removed to schematically show its internal structure;

FIG. 10 is a schematic diagonal view of a portion of the laser device of FIG. 9 to more clearly show its internal structure;

FIG. 11 is a schematic diagonal view of a portion of another prior art semiconductor laser device; and FIG. 12 is an equivalent circuit diagram of the laser devices of FIGS. 9, 10 and 11.

Throughout herein, like or equivalent components of different embodiments of the invention are indicated by the same numerals and may not necessarily be described in detail repetitiously.

DETAILED DESCRIPTION OF THE INVENTION

FIGS. 1 and 2 show a semiconductor laser device according to a first embodiment of this invention. Seen from outside, it is a sealed structure with a disk-shaped member referred to as "the stem 10", a cap 11 which is hermetically attached to a main surface of the stem 10, and three lead pins 15, 16 and 17 (referred to for convenience as "the first", "the second" and "the third", respectively) provided on the back surface of the stem 10 and extending externally therefrom. The first pin 15 is directly attached to the stem 10 so as to be electrically connected therewith. The second and the third pins 16 and 17 are each affixed to the stem 10 by way of an insulator 18, the second pin 16 serving to supply an electric current therethrough to the device.

Inside the sealed package thus formed with the stem 10 and the cap 11, there is a heat sink 20 affixed perpendicularly to the inner main surface of the stem 10, say, by soldering so as to be electrically connected to the first lead pin 15 through the electrically conductive stem 10. A metal with a high thermal conductivity such as Cu or Ag is used for the heat sink 20.

A layer of an electrical insulator 21 with a high thermal conductivity such as AlN, SiC or BeO is disposed on the opposite surface of the heat sink 20 distal from the stem 10, and a submount block (hereinafter referred to simply as "submount") 25, much thicker than the insulator layer 21 and of a relatively inexpensive electrically conductive material with a high thermal conductivity such as Si, is deposited on this insulator layer 21. On the opposite surface of this submount 25 distal from the insulator layer 21, a semiconductor laser element 30 with a p-n junction sandwiched between an electrode with one conductivity type and another electrode with the opposite conductivity type is directly mounted to an Al pad 31. The outer surfaces of the laser element 30, on the mutually opposite sides of the p-n junctions (that is, on the sides of these electrodes) will be herein referred respectively to "the p-surface" and "the n-surface"). The laser element 30 is deposited on the Al pad 31 in the so-called junction-down format such that its p-surface is electrically connected through the electrically conductive Al pad 31 to the submount 25.

Also provided inside the sealed package is a light-receiving element 50 directly mounted to the main surface of the stem 10 for receiving and thereby monitoring the laser light emitted backward from the laser element 30. The light-receiving element 50 is thus electrically connected to the first pin 15 through the stem 10. The top surface (facing towards the laser element 30) of the light-receiving element 50 is electrically connected to the third pin 17 through a metallic wire 51. The cap 11 is provided with a window at its ceiling part, fitted with a transparent glass plate 13 through which the laser light emitted forward (as shown by an arrow in FIG. 1) is transmitted to the exterior.

According to this embodiment of the invention, the n-surface of the laser element 30, distal from the Al pad 31, is electrically connected to the heat sink 20 by a metallic wire 32. The second lead pin 16 for supplying power is extended inward to a position near the submount 25 nearly parallel to the surface of the heat sink 20. There is another pad 35 of an electrically conductive material such as Al formed on the surface of the submount 25 and electrically connected to the second pin 16 by another metallic wire 37.

Through the laser device thus structured, a current is caused to flow from the second pin 16 sequentially through the metallic wire 37, the Al pad 35, the submount 25, the pad 31, the p-surface of the laser element 30, its n-surface and the metallic wire 32 to the heat sink 20, as shown by arrows in FIG. 2, such that the laser element 30 is driven and caused to emit laser. In the meantime, the heat, which is generated by the laser element 30, is efficiently transmitted away to the submount 25 because there is only the thermally conductive Al pad 31 between the laser element 30 and the submount 25, that is, there is no oxide layer (such as of $SiO_2$) with a poor thermal conductivity provided therebetween. The heat, which is transmitted to the submount 25 is further transmitted efficiently to the heat sink 20 through the layer of electrical insulator 21 characterizing this invention.

If one considers only the flow route of the electric current through the device, the insulator layer 21 may comprise any electrically insulating material. As explained above, however, the insulator 21 to be provided between the heat sink 20 and the submount 25 according to this invention is required to be able to transmit heat efficiently from the submount 25 to the heat sink 20. It is preferred that a material which is thermally more transmissive than the submount 25, such as AlN, SiC or BeO be used. Thus, the heat generated by the laser element 30 can be efficiently removed therefrom through the heat sink 20, and this means that the laser device thus formed according to this invention can be cooled efficiently, as desired.

Although a relatively expensive material such as AlN is used for the insulator layer 21, the production cost of the laser devices according to this invention is not significantly affected because the layer of insulator 21 according to this invention is already secured to the heat sink 20 when the laser element 30 is tested. That is, it is only the combination of the laser element 30 and the relatively inexpensive submount 25 that is subjected to a screen test and may be discarded as a result. In other words, the insulator layer 21 of a relatively expensive material remains affixed to the heat sink 20 and is not discarded as a result of a screening test.

FIG. 3 shows another semiconductor laser device according to a second embodiment of this invention, which is similar to the device described above with reference to FIGS. 1 and 2 and hence like or equivalent components are indicated by the same numerals. Unlike the device according to the first embodiment of the invention, a laser device according to the second embodiment of the invention has an electrically insulating oxide layer 38 also formed on the surface of the submount 25, and a metallic wiring pattern 39, which may comprise Al, is formed on this oxide layer 38. This metallic wiring pattern 39 is electrically connected not only through a metallic wire 46 to the n-surface of the laser element 30 (deposited similarly as according to the first embodiment of the invention), but also through another metallic wire 47 to the heat sink 20.

Through the laser device thus structured as shown in FIG. 3, an electric current is caused to flow from the second lead pin 16 sequentially through the metallic wire 37, the pad 35, the submount 25, the pad 31, the p-surface of the laser element 30, its n-surface, the metallic wire 46, the metallic wiring pattern 39 and the metallic wire 47 to the heat sink 20 such that the laser element 30 is activated and emits light.

The second embodiment is advantageous over the first embodiment when the device is subjected to a test of certain kinds. FIGS. 4A and 4B show when the laser element 30 already mounted to the submount 25 respectively according to the first and second embodiments of the invention is subjected to a test by means of a probe 61 connected to a measuring device 60 by separating the submount 25 from the insulator 21. For testing, say, the electrical and/or optical characteristics of the laser element 30 mounted according to the first embodiment of the invention shown in FIG. 2, the probe 61 is contacted directly to the laser element 30 as shown in FIG. 4A, and an electrical current is caused to flow from the measuring device 60 sequentially through an electrically conductive table 62 on which the submount 25 is placed, the submount 25 itself, the pad 31, the laser element 30 and the probe 61 back to the measuring device 60, as shown by arrows in FIG. 4A. For testing the laser element 30 mounted according to the second embodiment of the invention shown in FIG. 3, by contrast, the probe 61 is contacted instead to the metallic wiring pattern 39 formed on the oxide layer 38, as shown in FIG. 4B, and its electrical and optical characteristics are measured by causing an electrical current to flow similarly from the measuring device 60 sequentially through the table 62, the submount 25, the pad 31, the laser element 30, the metallic wire 46, the metallic pattern 39 and the probe 61 back to the measuring device 60, as shown by the arrows in FIG. 4B. It now goes without saying that the measuring method shown in FIG. 4B is preferable because the pressure of the contacting probe 61 is applied not to the pressure-sensitive and shock-sensitive laser element 30 but to the metallic pattern 39.

FIGS. 5 and 6 show still another semiconductor laser device according to a third embodiment of the invention adapted for high-frequency operations. It is to be emphasized that FIGS. 2 and 6 are similar and different only in that the metallic wire 32 of FIG. 2 connecting the n-surface of the laser element 30 with the heat sink 20 is replaced in FIG. 6 by another metallic wire 33 connecting the n-surface of the laser element 30 to the third lead pin 17 which is electrically insulated from the stem 10 and is extended to the interior of the sealed package.

Through the semiconductor laser device thus structured as shown in FIG. 6, an electric current is caused to flow from the second lead pin 16 sequentially through the metallic wire 37, the pad 35, the submount 25, the pad 31, the p-surface of the laser element 30, its n-surface and the metallic wire 33 to the third lead pin 17, as shown by arrows in FIG. 6 so as to activate the laser element 30 and to cause it to emit light. In other words, the laser-activating current does not flow through the heat sink 20 which is electrically connected to the package-forming stem 10. Thus, when the laser element 30 is activated, the capacitance of the submount 25 and the inductance of the package are in an electrically floating condition. This is shown in FIG. 7 by an equivalent circuit diagram. The laser device is thus adapted for high-frequency operations with dependable response characteristics. As for the heat generated by the laser element 30, it can be seen clearly that it is transmitted efficiently through the heat sink 20, as explained above with reference to the first embodiment of the invention.

FIG. 8 shows still another semiconductor laser device according to a fourth embodiment of the invention, which is similar to the third embodiment described above with reference to FIGS. 5 and 6 but different therefrom in the same way wherein the second embodiment is different from the first embodiment. In other words, the fourth embodiment is different from the third embodiment wherein an oxide layer 38 is also formed on the surface of the submount 25 and a metallic wiring pattern 39 is formed on this oxide layer 38. This metallic wiring pattern 39 is electrically connected not only through a metallic wire 46 to the n-surface of the laser element 30 but also through another metallic wire 48 to the third lead pin 17.

The advantage of the fourth embodiment over the third embodiment is the same as that of the second embodiment over the first embodiment explained above with reference to FIGS. 4A and 4B. In other words, when the laser element 30 is subjected to a test, say, for screening, the probe 61 will have to be pressed against the laser element 30 directly if it is mounted according to the third embodiment as shown in FIG. 4A but the probe 61 is not required to be pressed against the laser element 30 itself but is contacted with the metallic wiring pattern 39 as shown in FIG. 4B if the laser element is mounted according to the fourth embodiment. It also goes without saying that the semiconductor laser device according to the fourth embodiment of the invention is also adapted for high-frequency operations because the capacitance of the submount 25 and the inductance of the package formed by the stem 10 and the cap 11 are in an electrically floating condition when the laser device is activated and its equivalent circuit diagram will be as shown in FIG. 7.

The invention has been described above with reference to only a limited number of embodiments, but these illustrated embodiments are not intended to limit the scope of the invention. Many modifications and variations are possible within the scope of the invention. Thus, the disclosure is intended to be interpreted broadly. For example, the expression "metallic wiring pattern" need not necessarily be formed in any unusual pattern. As far as the purposes of the present invention are concerned, the metallic wiring patterns indicated, for example, by numeral 39 may be a metallic member of an ordinary kind which is electrically conductive. In summary, all such modifications and variations that may be apparent to a person skilled in the art are intended to be included within the scope of this invention.

What is claimed is:

1. A semiconductor laser device comprising:
 a metallic heat sink;
 an electrically conductive submount block;
 a plurality of externally extending lead pins;
 an electrical insulator which is a layer thinner than said submount block and disposed between and in contact with both said heat sink and said submount block;
 a semiconductor laser element having a p-n junction between a first electrode with one conductive type and a second electrode with opposite conductive type, said laser element being disposed on said submount block such that said first electrode is electrically connected with said submount block;
 a first connecting means for electrically connecting one of said lead pins with said second electrode; and
 a second connecting means for electrically connecting another of said lead pins with said submount block.

2. The semiconductor laser device of claim 1 further comprising an electrically insulating layer on said submount block, said first connecting means including a metallic member formed on said electrically insulating layer.

3. The semiconductor laser device of claim 2 wherein thermal conductivity of said electrical insulator is no smaller than that of said submount block.

4. The semiconductor laser device of claim 3 wherein said electrical insulator is of a material selected from the group consisting of AlN, SiC and BeO.

5. The semiconductor laser device of claim 2 wherein said electrical insulator is of a material selected from the group consisting of AlN, SiC and BeO.

6. The semiconductor laser device of claim 1 wherein thermal conductivity of said electrical insulator is no smaller than that of said submount block.

7. The semiconductor laser device of claim 6 wherein said electrical insulator is of a material selected from the group consisting of AlN, SiC and BeO.

8. The semiconductor laser device of claim 1 wherein said electrical insulator is of a material selected from the group consisting of AlN, SiC and BeO.

9. The semiconductor laser device of claim 1 wherein said submount block and said electrical insulator are separable.

10. A semiconductor laser device comprising:
 a metallic heat sink;
 an electrically conductive submount block;
 at least one externally extending lead pin;
 an electrical insulator which is a layer thinner than said submount block and disposed between and in contact with both said heat sink and said submount block;
 a semiconductor laser element having a p-n junction between a first electrode with one conductive type and a second electrode with opposite conductive type, said laser element being disposed on said submount block such that said first electrode is electrically connected with said submount block;
 a first connecting means for electrically connecting said heat sink with said second electrode; and
 a second connecting means for electrically connecting said one lead pin with said submount block.

11. The semiconductor laser device of claim 10 further comprising an electrically insulating layer on said submount block, said first connecting means including a metallic member formed on said electrically insulating layer.

12. The semiconductor laser device of claim 11 wherein thermal conductivity of said electrical insulator is no smaller than that of said submount block.

13. The semiconductor laser device of claim 12 wherein said electrical insulator is of a material selected from the group consisting of AlN, SiC and BeO.

14. The semiconductor laser device of claim 11 wherein said electrical insulator is of a material selected from the group consisting of AlN, SiC and BeO.

15. The semiconductor laser device of claim 10 wherein thermal conductivity of said electrical insulator is no smaller than that of said submount block.

16. The semiconductor laser device of claim 15 wherein said electrical insulator is of a material selected from the group consisting of AlN, SiC and BeO.

17. The semiconductor laser device of claim 10 wherein said electrical insulator is of a material selected from the group consisting of AlN, SiC and BeO.

18. The semiconductor laser device of claim 10 wherein said submount block and said electrical insulator are separable.

* * * * *